United States Patent [19]
Ito et al.

[11] Patent Number: 5,650,344
[45] Date of Patent: Jul. 22, 1997

[54] METHOD OF MAKING NON-UNIFORMLY NITRIDED GATE OXIDE

[75] Inventors: Akira Ito, Palm Bay; John T. Gasner, Satellite Beach, both of Fla.

[73] Assignee: Harris Corporation, Melbourne, Fla.

[21] Appl. No.: 503,048

[22] Filed: Jul. 17, 1995

[51] Int. Cl.$^6$ ................................................ H01L 21/318
[52] U.S. Cl. .................... 437/40; 437/42; 437/239; 437/244; 437/242; 437/978; 148/DIG. 43; 148/DIG. 44; 148/DIG. 112; 148/DIG. 114
[58] Field of Search ................ 437/40 GS, 41 GS, 437/42, 239, 242, 244, 920, 978, 983; 148/DIG. 31, DIG. 43, DIG. 44, DIG. 112, DIG. 114, DIG. 116

[56] References Cited

U.S. PATENT DOCUMENTS

| | | | |
|---|---|---|---|
| 4,528,211 | 7/1985 | Bhagat | 437/242 |
| 5,324,675 | 6/1994 | Hayabuchi | 437/978 |
| 5,382,533 | 1/1995 | Ahmad et al. | 437/242 |

OTHER PUBLICATIONS

A. B. Joshi et al., IEEE Trans. Electron Dev., 39(4)(1992)883, ". . . Rapid Thermal Reoxidation . . . of Rapid Thermally Nitrided Thin–Gate Oxides" Apr. 1992.

*Primary Examiner*—Charles L. Bowers, Jr.
*Assistant Examiner*—Leon Radomsky
*Attorney, Agent, or Firm*—Rogers & Killeen

[57] ABSTRACT

A method of making a semiconductor device in which a polysilicon gate is separated from a semiconductor substrate by a re-oxidized nitrided oxide film and in which the concentration of re-oxidized nitride in the film underlying the gate is non-uniform. The concentration of nitrogen in the substrate and the re-oxidized nitrided oxide along their interface and underlying the gate is non-uniform. The non-uniform concentrations are provided by incomplete shielding of the oxide by the gate during the nitriding and re-oxidizing processes.

19 Claims, 1 Drawing Sheet

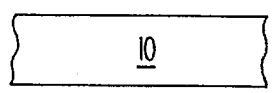
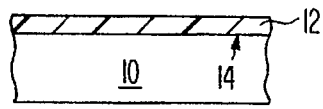
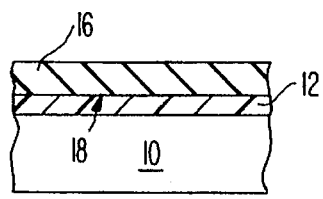
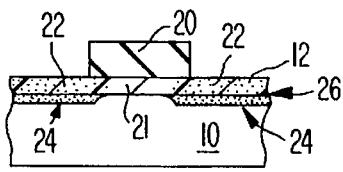
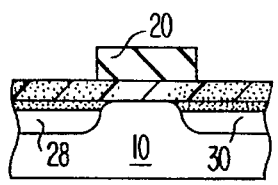
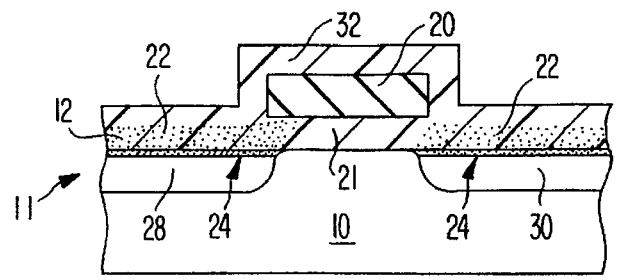
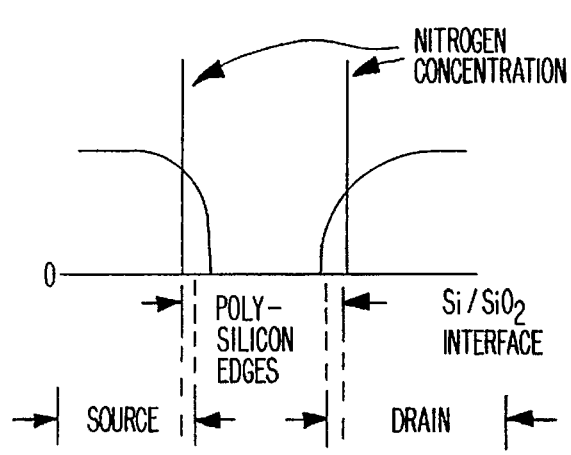
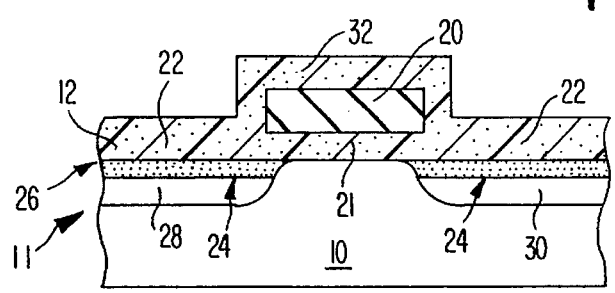

METHOD OF MAKING NON-UNIFORMLY NITRIDED GATE OXIDE

BACKGROUND OF THE INVENTION

The present invention relates generally to semiconductor devices and more specifically to such devices which have reoxidized nitrided oxide regions.

Until recently, various semiconductor devices, such as N and P type MOSFETs which include a polysilicon gate overlying a gate oxide, were formed with gates composed of regular oxide material, i.e. silicon dioxide gates in devices constructed from a silicon substrate. There is a strong trend toward scaling down the size of such devices without compromising performance capabilities.

One practice that has been employed in the manufacture of scaled down devices is the use of re-oxidized nitrided oxide material for gate oxides. It has been shown that the use of re-oxidized nitrided gate oxides (ONO gates) provides a significant improvement in gate oxide quality with respect to charge generation due to high field and radiation, retardation of boron diffusion from boron doped polysilicon gates, and hot electron resistance in both P and N-MOSFETs. Additionally, the high positive fixed charge at the edge of the polysilicon gates, which results from the use of ONO gates, beneficially increases the punch through voltage for P-MOSFETs.

It has been determined that the foregoing benefits do not all flow directly from the ONO gate, but also from the nitrogen region which forms in the substrate and the gate oxide along their mutual interface as the result of forming the ONO gate. The nitrogen region forms in both the substrate and in any overlying nitrided oxide material along the interface of the substrate and the overlying nitrided oxide, which may include all or part of the gate oxide. In prior art devices this nitrogen region is uniform along the interface of the gate oxide and the substrate, and typically has a nitrogen concentration level of upwards of 10–20% by atomic weight.

There are some disadvantages, however, associated with the ONO gates of the prior art and the accompanying underlying nitrogen regions. For example, the uniform ONO gates of the prior art result in a uniform high fixed charge density along the interface of the gate oxide and the substrate (i.e. over the entire width of the gate oxide). The high fixed charge density under the interior or center of the ONO gate increases scattering and thus detrimentally degrades mobility between the gate oxide and the substrate.

It has now been determined that nitrogen concentration levels of greater than about 4% will cause mobility to be unacceptably reduced. It has further been determined the nitrogen concentration levels of about 4% or somewhat less under the gate oxide provide adequate hot electron resistance and retardation of boron penetration from a polysilicon gate into the substrate. It is also known that a nitrogen concentration level of about 10% or greater is required under the periphery of the gate oxide to provide a high enough positive fixed charge density to sufficiently increase the punch-through voltage for P-MOSFETs.

Therefore, an improved and preferred device with an ONO gate may be formed such that the nitrogen region has a nitrogen concentration level of no more than about 4% under the center of the gate oxide and a nitrogen concentration level of at least about 10% at and beyond the periphery of the gate oxide. Other improved, but less preferred devices may be formed simply by providing a nitrogen region with a comparatively reduced level of nitrogen under the gate oxide, or in some instances by providing a nitrogen region which only partially extends under the gate oxide from the periphery towards the center thereof.

The aforementioned improved semiconductor devices having ONO gates may be formed by nitriding the gate oxide after the formation of a polysilicon gate above the gate oxide. The presence of the polysilicon gate may provide partial or near total shielding of the gate oxide underlying the polysilicon gate during the nitriding step (and also during the re-oxidizing step). The shielding during nitriding may reduce the concentration of re-oxidized nitrided material over the width of the gate oxide and particularly at the center thereof. Likewise, the shielding reduces the concentration of nitrogen in the nitrogen region underlying the gate oxide in direct proportion to the reduced concentration of re-oxidized nitrided material overlying the nitrogen region. Furthermore, the shielding may protect the gate oxide from being contaminated by unwanted particles during the nitriding and re-oxidizing steps.

Accordingly, it is an object of the present invention to provide a novel method of nitriding a gate oxide in a semiconductor device.

It is another object of the present invention to provide a novel method of selectively forming a nitrogen region with a non-uniform concentration of nitrogen in a semiconductor device.

It is yet another object of the present invention to provide a novel method of selectively forming a nitrogen region in a semiconductor device with a non-uniform concentration of nitrogen over the width of a gate oxide and having a minimum level of nitrogen under the center thereof.

It is still another object of the present invention to provide a novel method of forming a polysilicon gate above a gate oxide prior to re-oxidizing and nitriding the gate oxide.

It is a further object of the present invention to provide a novel method of protecting a gate oxide from contamination during nitriding and re-oxidizing processes.

It is yet a further object of the present invention to provide a novel device having a nitrogen region with a non-uniform concentration of nitrogen under a gate oxide.

It is still yet a further object of the present invention to provide a novel device having a non-uniformly nitrided and re-oxidized gate oxide.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1A is an elevation in cross-section of a semiconductor device substrate.

FIG. 1B is an elevation in cross-section of the semiconductor device of FIG. 1A after the addition of an oxide film.

FIG. 1C is an elevation in cross-section of the semiconductor device of FIG. 1B after the addition of a polysilicon layer.

FIG. 1D is an elevation in cross-section of the semiconductor device of FIG. 1C after the formation of a polysilicon gate.

FIG. 1E is an elevation in cross-section of the semiconductor device of FIG. 1D after the formation of source and drain regions.

FIG. 1F is an elevation in cross-section of the semiconductor device of FIG. 1E after the addition of a second oxide film.

FIG. 2A is a graph of nitrogen concentration verses position along the substrate/oxide film interface for the semiconductor device of FIG. 1F.

FIG. 2B is a graph of nitrogen concentration verses position along the substrate/oxide film interface for the semiconductor device of FIG. 3.

FIG. 3 is an elevation in cross-section of a semiconductor device formed in accordance with an alternative embodiment of the invention.

DESCRIPTION OF PREFERRED EMBODIMENTS

A method of carrying out the present invention is illustrated by FIGS. 1A–1F, which are elevational cross-section views of a semiconductor device at various stages of the method. In preparation for the Selectively re-Oxidized Nitrided gate Oxide (SONO) process, a silicon semiconductor substrate 10, having a thickness suitable for the formation of N and/or P type MOSFET's for example, may be provided as shown in FIG. 1A.

With reference to FIG. 1B, an oxide film 12 may be grown in a dry oxygen ambient on an upper surface 14 of the substrate 10. Thereafter a polysilicon layer 16, between 150 and 600 nanometers thick, may be deposited on the upper surface 18 of the oxide film 12 and doped, as shown in FIG. 1C. Selective areas of the polysilicon layer 16 are masked using a photo process, and the exposed areas etched (e.g., Reactive Ion Etching) to form a polysilicon gate 20 on the oxide film 12, shown in FIG. 1D. The polysilicon gate 20 defines a gate oxide 21 as the portion of the oxide film 12 under the polysilicon gate 20.

The SONO process of the method is initiated by nitriding the oxide film of the semiconductor device shown in FIG. 1D. Nitriding may be conducted in an ammonia ($NH_3$) ambient having a temperature of 900° to 1200° C. for between 1 and 180 seconds. The polysilicon gate 20 shields the underlying gate oxide 21 with respect to the nitriding ambient. Accordingly the gate oxide 21 is nitrided over the width of the gate oxide 21 to a lesser and lesser extent as the center of the gate oxide is approached.

The SONO process is completed by re-oxidizing the nitrided oxide film in a dry oxygen ambient having a temperature of 900° to 1200° C. for between 10 and 180 seconds to form the re-oxidized nitrided region 22 (shown as the shaded region). As in the nitriding step, the polysilicon gate 20 shields the gate oxide with respect to the re-oxidizing ambient, causing the gate oxide to be re-oxidized to a lesser extent as the center of the gate oxide is approached.

Carrying out the SONO process after the formation of the polysilicon gate 20 on the oxide film 12 enables the formation of a gate oxide which is comprised of a decreasing concentration of re-oxidized nitrided oxide as the center of the gate oxide is approached from the periphery thereof (i.e., the concentration of re-oxidized nitrided oxide is non-uniform over the width of the gate oxide). The actual concentration of re-oxidized nitrided oxide in the gate oxide may range from zero to greater than about 20%.

Variation in the temperatures of the nitriding and reoxidizing ambients, as well as variation in the time of exposure to the ambients, and channel length all may affect the concentration of re-oxidized nitrided oxide in various portions of the gate oxide 21. Higher temperatures and longer exposure times produce a gate oxide 21 in which the concentration of re-oxidized nitrided oxide is higher and/or in which a greater percentage of the gate oxide 21 is comprised of re-oxidized nitrided oxide. For example, in FIG. 1D the gate oxide 21 is re-oxidized and nitrided only in the shaded region 22. If higher ambient temperatures and/or longer ambient exposure times were used in the SONO process, the re-oxidized nitrided region 22 would tend to extend further towards the center of the gate oxide 21, and in some instances extend all the way through the gate oxide so that the gate oxide is fully made up of re-oxidized nitrided oxide.

With continued reference to FIG. 1D, the SONO process also results in the formation of a nitrogen region 24 in the substrate 10 and the oxide film 12 along the interface 26 of the oxide film 12 and the substrate 10. The formation of the nitrogen region 24 is related to the formation of the re-oxidized nitrided region 22, and consequently the extension of the nitrogen region 24 along the interface 26 corresponds substantially with the extension of the re-oxidized nitrided region 22 in the oxide film 12. Preferably the nitrogen region 24 has a nitrogen concentration between about 0.1% and 20.0% by atomic weight at the interface 26. The nitrogen concentration may vary within the region 24 along the interface 26 and typically tapers off in proportion with the tapering off of the concentration of re-oxidized nitrided oxide towards the center of the gate oxide 21.

FIG. 2A is a graph of nitrogen concentration verses position along the interface 26 for the device depicted in FIG. 1D. As is evident from FIG. 2A, the nitrogen concentration falls off sharply to zero under the periphery of the gate oxide 21. After completion of the SONO process, N and P-channel source and drain regions, 28 and 30, shown in FIG. 1E, may be formed by any conventional process. For example, the source and drain regions may be formed by phosphorus N-lightly doped drain (LDD) and boron P-LDD implants, respectively.

A spacer oxide may then be deposited for forming heavily doped N and P-channel source and drain regions by P+ boron implant and N+ implant (which also may be used to dope the polysilicon gate instead of $POCl_3$). Thereafter the source and drain junctions may be annealed using rapid thermal processing (RTP) equipment or a diffusion furnace. Alternatively the SONO process may be used to anneal the source and drain functions.

Finally, a second oxide film 32 is formed over the upper surface of the oxide film 12 and the polysilicon gate 20 to form the semiconductor device 11, shown in FIG. 1F, which may be a P-MOSFET, N-MOSFET or some other device.

In a preferred embodiment of the invention, the resulting device 11 has a cross-section similar to that shown in FIG. 3. With continued reference to FIG. 3, the entire gate oxide 21 is comprised of re-oxidized nitrided oxide, and the nitrogen region 24 extends along the interface 26 under the entire gate oxide 21. In this preferred embodiment the nitrogen region 24 has a concentration that is no greater than about 4% by atomic weight under the center of the gate oxide 21 and at least about 10% or greater by atomic weight above the source and drain regions, 28 and 30. FIG. 2B is a graph of nitrogen concentration verses position on the interface 26 for the device depicted in FIG. 3.

One advantage of nitrogen regions having at least about 10% nitrogen above the source and drain regions is that they bring about a high fixed charge density between the oxide film 12 and the substrate 10 at the periphery of the gate oxide 21. The high fixed charge density at the periphery increases the punch through voltage for P-MOSFETs, and increases the hot electron resistance for both P and N-MOSFETs, both of which are desirable characteristics in such semiconductor devices.

Conversely, high fixed charge density is avoided under the center of the gate oxide 21 as a result of there being a lower concentration of nitrogen under the center of the gate oxide 21. Accordingly, it is preferable for the nitrogen concentration to be non-uniform along the interface 26 under the gate oxide, varying between about 10% under the periphery of the gate oxide and less than about 4% under the center of the gate oxide. The absence of high fixed charge density under the gate oxide 21 advantageously permits mobility between the gate oxide 21 and the portion of the substrate 10 underlying the gate oxide. If nitrogen concentration was higher than about 4% under the center of the gate oxide 21, mobility could be undesirably degraded between the gate oxide 21 and the substrate 10.

High fixed charge density under the gate oxide 21 could potentially be avoided in prior art SONO processes by increasing the re-oxidation time and temperature (as fixed charge density decreases with increasing re-oxidation times and temperatures). Higher re-oxidation time and temperature however, may adversely affect the silicon wafers by causing crystalline defects (slips) in the wafers. Accordingly, the available prior art technique for controlling high fixed charge density unacceptably exposes the silicon wafers from which the devices are constructed to risk of damage.

Another advantage associated with the preferred embodiment of the method is that the nitrogen region underlying the gate oxide 21 retards the diffusion of boron from the boron doped polysilicon gate 20 into the silicon substrate 10 underlying the gate oxide 21. It has been determined that the higher the concentration of nitrogen, the smaller the boron penetration into the substrate. The benefits of the nitrogen region 24 as a boron diffusion barrier is particularly evident in short channel devices, which typically have a higher concentration of nitrogen (at least 4%) under the center of the gate oxide 21 than do longer channel devices.

A further advantage of all the present methods is that the gate oxide is protected from being contaminated with unwanted particles during the SONO process as a result of the formation of the polysilicon gate over the gate oxide before carrying out the SONO process.

As is evident from the foregoing, the above advantages may be obtained because the polysilicon gate 20 is formed before the SONO process is carried out. Forming the polysilicon gate before carrying out SONO facilitates the formation of the re-oxidized nitrided region 22 and the nitrogen region 24 which taper off with approach to the center of the gate oxide 21. The tapering off of these regions results in a novel semiconductor device 11 having the advantageous characteristics discussed above.

In alternative embodiments of the novel method, the SONO process may be carried out after the formation of N and P-channel source and drain regions in the device, and/or after the formation of the second oxide film over the upper surface of the oxide film and the polysilicon gate. Both of these alternative embodiments result in the formation of re-oxidized nitrided gate oxides and nitrogen regions which taper off with approach to the center of the gate oxide.

In other alternative embodiments of the novel method, the oxide film may be formed in a wet ambient which may or may not include hydrogenchloride (HCl) or trichloroethane (TCA). Still further alternative embodiments may utilize an $N_2O$ ambient for nitriding the oxide film instead of $NH_3$.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of forming a gate oxide having a non-uniform concentration of re-oxidized nitrided oxide for a semiconductor device comprising the steps of:

a) forming an oxide film on the upper surface of a semiconductor substrate;

b) forming a polysilicon layer on the oxide film;

c) selectively removing the polysilicon layer to define a polysilicon gate with the oxide film underlying the polysilicon gate defining a gate oxide;

d) exposing the oxide film to a nitrogen containing ambient to thereby nitride the oxide film and to form a region of non-zero nitrogen concentration along an interface of the semiconductor substrate and the oxide film; and e) exposing the nitrided oxide film to a dry oxygen ambient to thereby form a re-oxidized nitrided oxide film in which a concentration of re-oxidized nitrided oxide is non-zero, and in which the re-oxidized nitrided oxide film and the region of non-zero nitrogen concentration underlie the entirety of the gate.

2. The method of claim 1 wherein the concentration of re-oxidized nitrided oxide in a center of the gate oxide is less than in a periphery thereof.

3. The method of claim 1 further comprising the additional step of forming a second oxide film overlying the oxide film and polysilicon gate without increasing the thickness of the gate oxide.

4. The method of claim 1 further comprising the additional step of forming source and drain regions in the semiconductor substrate prior to exposing the oxide film to the nitrogen containing ambient.

5. The method of claim 1 wherein the concentration of nitrogen in the portion of the nitrogen region underlying the gate is non-uniform.

6. The method of claim 5 wherein the concentration of nitrogen in the portion of the nitrogen region underlying the gate is between about 0.1% and 20.0% by atomic weight along the interface.

7. The method of claim 5 wherein the concentration of nitrogen in the portion of the nitrogen region underlying the gate is greater than zero and less than about 4% by atomic weight under a center of the gate and greater than about 10% by atomic weight under a periphery of the gate.

8. The method of claim 1 wherein the exposure of the oxide film to the nitrogen containing ambient is between about 1 and 180 seconds at a temperature between about 900° C. and 1200° C.

9. The method of claim 1 wherein the exposure of the nitrided oxide film to the dry oxygen ambient is between about 10 and 180 seconds at a temperature between about 900° C. and 1200° C.

10. The method of claim 1 wherein the nitrogen containing ambient contains $NH_3$.

11. The method of claim 1 wherein the nitrogen containing ambient contains $N_2O$.

12. In a method of forming a re-oxidized nitrided oxide region in a semiconductor device having an oxide film formed on a semiconductor substrate and a polysilicon gate formed on the oxide film, the improvement comprising forming the polysilicon gate on the oxide film prior to nitriding and re-oxidizing the oxide film and nitriding and re-oxidizing the oxide film so that the re-oxidized nitrided oxide region extends completely under the gate and has a non-zero concentration of re-oxidized nitrided oxide.

13. The method of claim 12 wherein the nitriding of the oxide film forms a nitrogen region in the semiconductor substrate with the concentration of nitrogen in the region underlying the gate being non-uniform.

14. The method of claim 13 wherein the concentration of nitrogen in the region underlying a center of the gate is no greater than about 4% by atomic weight.

15. The method of claim 13 wherein the concentration of nitrogen in the region underlying the gate is between about 4% and 10% by atomic weight.

16. The method of claim 13 wherein the concentration of nitrogen in the region is at a minimum underneath the center of the gate.

17. A method, in a semiconductor device having an oxide film formed on a semiconductor substrate and a polysilicon gate formed on the oxide film, of (i) forming a gate oxide having a non-uniform concentration of re-oxidized nitrided oxide within said oxide film, and (ii) forming a nitrogen region along an interface of the oxide film and substrate having a non-uniform concentration of nitrogen under the gate oxide, the method comprising the steps of:

a) forming an oxide film on an upper surface of a semiconductor substrate;

b) forming a polysilicon layer on the oxide film;

c) selectively removing the polysilicon layer to define a polysilicon gate having a width with the oxide film under the polysilicon gate defining a gate oxide;

d) exposing the oxide film and polysilicon gate for between about 1 and 180 seconds to a nitrogen containing ambient having a temperature between about 900° C. and 1200° C., the polysilicon gate partially shielding the gate oxide from exposure to the nitrogen containing ambient and thereby non-uniformly nitriding the gate oxide over the width thereof and forming a nitrogen region having a non-uniform concentration of nitrogen under the gate oxide; and e) exposing the oxide film for between about 10 and 180 seconds to a dry oxygen ambient having a temperature between about 900° C. and 1200° C., thereby forming a gate oxide having a non-uniform and non-zero concentration of re-oxidized nitrided oxide over an entirety of the width thereof.

18. A method of providing a non-uniform concentration of nitrogen in a semiconductor substrate underlying a gate oxide comprising the step of incompletely shielding the gate oxide with a gate prior to nitriding the gate oxide and nitriding the gate oxide so that the non-uniform concentration of nitrogen is greater than zero and extends completely under the gate.

19. A method of providing a non-uniform boron diffusion barrier between a boron doped polysilicon gate and an underlying semiconductor substrate comprising the step of incompletely shielding a gate oxide between the polysilicon gate and the substrate prior to nitriding the gate oxide and nitriding the gate oxide so that the non-uniform concentration of nitrogen is greater than zero and extends completely under the gate.

* * * * *